United States Patent
Frischeisen et al.

(10) Patent No.: US 11,760,929 B2
(45) Date of Patent: Sep. 19, 2023

(54) CONVERSION ELEMENTS COMPRISING AN INFILTRATION MATRIX

(71) Applicant: OSRAM Opto Semiconductors GmbH, Regensburg (DE)

(72) Inventors: Jörg Frischeisen, Schwabmünchen (DE); Nusret Sena Gueldal, Regensburg (DE); Angela Eberhardt, Augsburg (DE); Vesna Mueller, Vaterstetten (DE); Florian Peskoller, Ingolstadt (DE); Pascal Rabenbauer, Bobingen (DE); Thomas Huckenbeck, Augsburg (DE); Jürgen Bauer, Wielenbach (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 54 days.

(21) Appl. No.: 17/292,360

(22) PCT Filed: Nov. 13, 2019

(86) PCT No.: PCT/EP2019/081124
§ 371 (c)(1),
(2) Date: May 7, 2021

(87) PCT Pub. No.: WO2020/099460
PCT Pub. Date: May 22, 2020

(65) Prior Publication Data
US 2022/0002620 A1    Jan. 6, 2022

(30) Foreign Application Priority Data
Nov. 14, 2018 (DE) .................. 10 2018 128 536.1

(51) Int. Cl.
*C09K 11/77* (2006.01)
*C03C 14/00* (2006.01)
(Continued)

(52) U.S. Cl.
CPC ........ *C09K 11/7774* (2013.01); *C03C 14/006* (2013.01); *C09K 11/02* (2013.01);
(Continued)

(58) Field of Classification Search
CPC . H01L 33/502; C09K 11/7774; C09K 11/025; C09K 11/77342; C09K 11/77347;
(Continued)

(56) References Cited

U.S. PATENT DOCUMENTS

2015/0069299 A1* 3/2015 Pan ............... C09K 11/7774
                                                252/301.4 H
2016/0233392 A1   8/2016 Deeben et al.
(Continued)

FOREIGN PATENT DOCUMENTS

DE    102017104127 A1    8/2018
DE    102017104128 A1    8/2018
(Continued)

OTHER PUBLICATIONS

International Search Report issued in International Patent Application No. PCT/EP2019/081124 dated Feb. 20, 2020.

*Primary Examiner* — C Melissa Koslow
(74) *Attorney, Agent, or Firm* — ArentFox Schiff LLP

(57) ABSTRACT

The invention relates to a conversion element comprising a wavelength-converting conversion material, a matrix material in which the conversion material is inserted, and a substrate on which the matrix material and the conversion material are directly arranged, the matrix material comprising at least one condensed sol-gel material selected from the following group: water glass, metal phosphate, aluminium phosphate, monoaluminium phosphate, modified monoaluminium phosphate, alkoxytetramethoxysilane, tetraethyl orthosilicate, methyltrimethoxysilane, methyltriethoxysilane, titanium alkoxide, silica sol, metal alkoxide, metal (Continued)

oxane or metal alkoxane, the conversion element being arranged in the beam path of a laser source, the conversion element being mounted in a mechanically immobile manner in relation to the laser source, and the radiation of the laser source being dynamically arranged in relation to the conversion element.

13 Claims, 14 Drawing Sheets

(51) Int. Cl.
  *C09K 11/02* (2006.01)
  *H01L 33/50* (2010.01)
  *C09K 11/88* (2006.01)
  *C09K 11/70* (2006.01)
  *C09K 11/08* (2006.01)
(52) U.S. Cl.
  CPC ............ *C09K 11/025* (2013.01); *C09K 11/70* (2013.01); *C09K 11/7731* (2013.01); *C09K 11/77342* (2021.01); *C09K 11/77347* (2021.01); *C09K 11/77348* (2021.01); *C09K 11/883* (2013.01); *H01L 33/502* (2013.01); *C09K 11/0883* (2013.01)
(58) Field of Classification Search
  CPC .......... C09K 11/77348; C09K 11/7731; C09K 11/883; C09K 11/0883; C09K 11/70
  See application file for complete search history.

(56) References Cited

U.S. PATENT DOCUMENTS

| 2020/0116322 A1* | 4/2020 | Eberhardt | ................. F21V 9/32 |
| 2021/0231294 A1* | 7/2021 | Fukumoto | ............. C09K 11/02 |

FOREIGN PATENT DOCUMENTS

| DE | 102017104135 A1 | | 8/2018 |
| DE | 102018125183 A1 | | 4/2020 |
| EP | 1696016 A1 | | 8/2006 |
| WO | 2005052087 A1 | | 6/2005 |
| WO | 2018158090 A1 | | 9/2018 |
| WO | WO 2018/158090 | * | 9/2018 |
| WO | WO 2019/230850 | * | 12/2019 |

* cited by examiner

CONVERSION ELEMENTS COMPRISING AN INFILTRATION MATRIX

This application is a 35 U.S.C. § 371 National Phase of PCT Application No. PCT/EP2019/081124, filed Nov. 13, 2019, which claims priority to German Application No. 10 2018 128 536.1, filed Nov. 14, 2018, the disclosures of which are hereby incorporated by reference herein in their entireties.

Many LEDs are based on combining a chip as a light source and a conversion element using e.g. phosphors to convert at least part of the radiation of the light source (most frequently blue light) into light having a different wavelength. The conversion element is usually platelet-shaped, usually corresponding approximately to the size of the chip and is bonded onto it. The thermal conductivity of the conversion element is a decisive factor for potentially utilizing the LED.

For LED applications wherein high luminance is required, such as stage lighting or headlights, it is therefore essential that the conversion element has high thermal conductivity. This is especially true for warm white applications (e.g. 3200 K) and cool white applications (e.g. 5700 K or 6500 K) wherein a high color rendering index (e.g. CRI 80 or even CRI 90) is also required (i.e. a comparatively high red component in the spectrum, typical red phosphors being particularly critical for high operating currents and operating temperatures) and which are operated at high current densities ($>1$ A/mm$^2$).

Inorganic conversion elements are also known which have a high filler content of phosphor and are embedded, for example, in a matrix of water glass or condensed monoaluminum phosphate, resulting in good thermal conductivity which can still be enhanced by the high volume shrinkage of the matrix material. However, due to the volume shrinkage of water, which in this case acts as both a solvent and a condensation product, interconnected microchannels are formed in the inorganic matrix during drying as well as during the thermal condensation process (curing), resulting in some porosity of the conversion element. This correspondingly reduces the thermal conductivity of the conversion element and moreover increases scattering, which usually detrimentally impacts efficiency.

Especially for high CRI applications, silicone is typically used as the matrix for the phosphor. However, the silicone has low thermal conductivity and relatively low thermal stability, so that LED applications are usually limited to current densities of $<1$ A/mm$^2$.

Therefore, applications requiring higher power levels usually use conversion elements made of ceramics that are bonded to the chip using silicone. They have good thermal conductivity, but CRI and color locus are very limited due to the manufacturing process.

A conversion element where the phosphor is embedded in glass conducts heat better than silicone, but with this, reaching a CRI of >80 is also challenging, as moisture-stable glasses usually require processing at temperatures above 500° C., which will damage a red phosphor component such as CaAlSiN.

The three conversion elements mentioned above are often thicker than 100 μm, which is disadvantageous for good heat dissipation thus limiting the possible applications. Therefore, in addition to high chromaticity, flexibility and a CRI>80, conversion elements that are maximally thin and highly filled as possible are of great interest.

Therefore, it was the object of the present invention to overcome the disadvantages of prior art and to provide a novel conversion element, a novel process for producing a conversion element and a novel optoelectronic semiconductor device.

The object of the present invention will be solved by a conversion element according to a first aspect of the present disclosure, a process for producing a conversion element according to a second aspect of the present disclosure, and an optoelectronic semiconductor device according to a third aspect of the present disclosure.

Advantageous further developments and embodiments are the subject of the dependent patent claims.

An object of the present invention is a conversion element comprising:
  at least one matrix comprising at least one infiltration matrix,
  10 to 50 vol % of at least one phosphor,
  optionally at least one additive, wherein the conversion element has a porosity of 0 to 20 vol %.

In the context of the present invention, a conversion element is an optoelectronic device which is used to convert light having a specified first wavelength (primary radiation), completely or partially, into light having at least a second wavelength (secondary radiation).

In the context of the present invention, the primary radiation may be excitation wavelengths in the range of 250 nm to 700 nm. In one embodiment, the primary radiation is in the range of 300 nm to 570 nm, preferably in the range of 350 nm to 500 nm, more preferably in the range of 400 nm to 490 nm (blue). In an alternative embodiment, the primary radiation is in the range of 490 nm to 575 nm (green). In still another embodiment, the primary radiation is in the range of 250 nm to 380 nm (UV). In still another embodiment, the primary radiation is in the range of 575 nm to 700 nm.

In the context of the present invention, the secondary radiation may be emission wavelengths in the range of 300 nm to 1600 nm. In one embodiment, the secondary radiation is white light preferably in the wavelength range of 380 nm to 780 nm (visible light). In an alternative embodiment, the secondary radiation is colored light, for example, in the range of 490 nm to 575 nm (green light), 575 nm to 585 nm (yellow light), 585 nm to 650 nm (orange light), 650 nm to 780 nm (red light), and from 780 nm to 1600 nm (NIR).

The conversion of primary radiation into secondary radiation can be a so-called full conversion or a partial conversion. A full conversion is the complete conversion of primary radiation into a defined secondary radiation. A partial conversion is the partial conversion of the primary radiation into a secondary radiation. Thus, in partial conversion, the emitted light is composed of light from the primary radiation and the secondary radiation.

In one embodiment, the conversion element emits radiation having a color temperature between 2500 K to 4500 K. The color rendering index CRI may be in the range of between 70 and 100.

In one embodiment, the conversion element emits radiation having a color temperature between 4500 K to 8000 K. The color rendering index CRI can be in the range of between 70 and 100.

For example, light of a specific first wavelength (primary radiation) can be emitted from an InGaN or GaN chip.

A conversion element according to the invention has a layer thickness in the range of 5 μm to 150 μm. For partial conversion, a conversion element according to the invention preferably has a layer thickness in the range from 5 μm to 120 μm and particularly preferably from 5 μm to 80 μm. The substrate, if any, will not be considered when determining the layer thickness.

For a color temperature between 2500 K to 4500 K (for excitation with blue LED), the layer thickness of a conversion element according to the invention is preferably in the range of 20 μm to 120 μm, and particularly preferably in the range of 25 μm to 80 μm.

For a color temperature ranging between 4500 K to 8000 K (for excitation with blue LED), the layer thickness of a conversion element according to the invention is preferably in the range from 5 μm to 100 μm, particularly preferably in the range from 5 μm to 60 μm.

Particularly advantageously, the at least one matrix comprises a material that has a high volume shrinkage, allowing maximally thin and thus maximally high-filled conversion elements to be produced (typical layer thicknesses are e.g. <65 μm, compared to prior art technologies of e.g. >100 μm).

In one embodiment, the matrix material is an inorganic material. Preferably, the inorganic material is a water glass, such as lithium water glass, sodium water glass, potassium water glass, or a mixture thereof. In one embodiment, the water glass is a condensed water glass. In one embodiment, the water glass is a chemically cured (for example, by ion exchange using aluminum phosphate) water glass.

Water glass generally refers to glassy, i.e. amorphous, water-soluble sodium, potassium and/or lithium silicates or aqueous solutions thereof solidified from melt. Condensed or cured water glass differs from a conventional glass in such properties as porosity.

The matrix may also be materials selected from the group consisting of condensed monoaluminum phosphate, a modified condensed monoaluminum phosphate, a condensed aluminum phosphate, a condensed metal phosphate.

The matrix may also be sols such as alkoxytetramethoxysilane, alkoxysilane, tetramethoxysilane, tetraethylorthosilicate, methyltrimethoxysilane, methyltriethoxysilane, titanium alkoxide, metal alkoxide, metal oxane, metal alkoxane, and mixtures thereof in condensed form.

Furthermore, the matrix may also include other inorganic materials. The inorganic materials may be side products from the manufacturing process, for example, if a chemical curing agent (e.g., aluminum phosphate) is used in the production of the matrix from water glass, a reaction product of the curing process (e.g., alkali phosphate is formed when the alkali in the water glass is replaced with aluminum in the silicate framework using ion exchange) may be present. Side products resulting from reaction with ambient air are also possible (e.g., alkali carbonate).

The matrix may be present in the conversion element in an amount in the range of 5 vol % to 30 vol %, preferably in the range of 7 vol % to 25 vol %, more preferably in the range of 10 vol % to 20 vol %, based on the total volume of the conversion element.

The at least one matrix of the conversion element according to the invention comprises at least one infiltration matrix.

In the context of the invention, an infiltration matrix is understood to be a matrix that infiltrates into the pores of the matrix forming its own matrix in the pores of the matrix. In a preferred embodiment, the infiltration matrix thus closes the pores of the matrix.

In the context of the invention, a pore is understood to be a network of cavities having at least one opening to the outer surface of the matrix.

Particularly advantageously, the material of the infiltration matrix has a low volume shrinkage. In an alternative embodiment, the material of the infiltration matrix has a high volume shrinkage.

Basically, the same materials as for the matrix may be used for the infiltration matrix. As described above they are tetraethyl orthosilicate, methyltrimethoxysilane, methyltriethoxysilane, titanium alkoxide, metal alkoxide, metal oxane, metal alkoxane and mixtures thereof in condensed form, in addition to water glass and tetramethoxysilane.

The infiltration matrix is preferably an inorganic material, especially a metal oxide, silicon dioxide or a silicate.

In one embodiment, the infiltration matrix is a condensed inorganic sol-gel material.

In one embodiment, the infiltration matrix is a condensed silicate-based material. Silicate-based materials can be processed at very low temperatures, they have low viscosity, and are chemically and thermally stable as well as optically transparent.

Sol-gel materials are materials prepared in a sol-gel process.

In the context of the present invention, a sol is understood to be a dispersion of a "polymer-like" solid phase in a liquid phase.

In the context of the present invention, a gel is understood to be a viscous mass formed when the particles of a sol are further polymerized.

By a sol-gel according to the present invention a mixture between the two phase states of the sol and the gel is meant, wherein all conceivable percentage proportions of the two phase states are conceivable. For example, a sol-gel is also referred to when the proportion of sol is 100% and the proportion of gel is 0%, as well as when the proportion of sol is 0% and the proportion of gel is 100%.

In general, in a sol-gel reaction, a metal precursor is hydrolyzed by a solvent, and the hydrolyzed metal precursor condenses to other hydrolyzed metal precursor molecules while dehydrating. This polycondensation reaction of several metal precursor molecules results in formation of metal oxides and an increase in viscosity of the mixture.

Briefly, the reaction can proceed as follows, the stoichiometry being merely exemplary:

$$MX + ROH \rightarrow M\text{-}OR + HX \tag{I}$$

$$M\text{-}OR + H_2O \rightarrow M\text{-}OH + ROH \tag{II}$$

MX is understood to mean a metal halide. ROH represents an alcohol. M-OH represents the hydrolyzed metal precursor.

If a metal alkoxide is used as the metal precursor, a catalyst is often also present during hydrolysis of the metal precursor. The catalyst may be an acid.

Briefly, in one embodiment, the reaction to form the sol-gel proceeds as follows, the stoichiometries being merely exemplary:

$$M\text{-}OR + M\text{-}OH \rightarrow M\text{-}O\text{-}M + ROH \tag{III}$$

The general formula M-OR is a metal alkoxide, M-OH is a hydrolyzed metal precursor, and M-O-M represents the basic structure of the sol-gel.

More generally, the metal precursor may be a metal halide or metal alkoxide.

Preferably, the metals of the metal precursor are selected from the group consisting of alkaline earth metals, transition metals, semimetals or boron group. Especially, the metal of the metal precursor may be selected from the 2nd, 4th, 5th, 12th, 13th or 14th group of the periodic table of the elements.

The metal halides may be chlorides, bromides or iodides of the metals.

In one embodiment, the metal salt is selected from the group consisting of metal halides, metal acetates and metal oxalates.

In one embodiment, the metal alkoxide is selected from the group consisting of metal alkoxides, alkyl metal alkoxides, and aryl metal alkoxides.

An alkoxide is a compound of the general formula $M(RO)_n$, wherein M=metal ion, R=alkyl, aryl and n=valence of the metal ion.

The metal alkoxides may be methoxides, ethoxides, butoxides, propoxides, isopropoxides, etc. of the metals.

The metal alkoxides may also be partially alkylated metal alkoxides. In this case, at least one alkoxide group is replaced by an alkyl group. The presence of at least one alkyl group may result in stabilization of the hydrolyzed metal precursor and stabilization of the sol-gel.

Examples of metal precursors include tetraethyl orthosilicate (TEOS), tetramethyl orthosilicate (TMOS), triethoxymethylsilane (MeTEOS), and trimethoxymethylsilane (MeTMOS).

Other examples of metal precursors within the scope of the present invention include $InCl_3$, $SnCl_4$, $SbCl_5$, $Zn(OAc)_2$, $ZnCl_2$, $ZnBr_2$, zinc methoxide, $Sb(OAc)_3$, $In(OAc)_3$, $Sn(OAc)_4$, $AlCl_3$, Al-isopropoxide, $TiCl_4$, titanium(IV) ethoxide, $NbCl_5$, niobium ethoxide, $BaCl_2$, barium isopropoxide.

In one embodiment, at least one metal precursor is selected from the group consisting of metal halides, metal acetates, metal oxalates, metal alkoxides, alkyl metal alkoxides, and aryl metal alkoxides.

In one embodiment, the sol-gel comprises various metal precursors.

In one embodiment, the sol-gel comprises a compound as a metal precursor.

In one embodiment, the silicate-based sol-gel comprises TEOS, MeTEOS, water, silica nanoparticles and/or a silica nanoparticle dispersion, and an acid (e.g., HCl) as a catalyst.

By selecting suitable metal precursors, the refractive index of the infiltration matrix formed from the sol-gel can be adjusted. A higher refractive index than that of, for example, silicone would increase the light out-coupling from the light-emitting layer (or chip).

In one embodiment, the infiltration matrix is selected from the group consisting of $ZrO_2$, $TiO_2$, $Al_2O_3$, ITO (indium tin oxide), $SiO_2$, $Y_2O_3$, $HfO_2$, and combinations thereof.

Particularly preferred the infiltration matrix is $SiO_2$ for a regular-refractive infiltration matrix and $TiO_2$ for a high-refractive infiltration matrix.

The infiltration matrix may be present in the conversion element in an amount in the range of 5 vol % to 85 vol %, preferably in the range of 10 vol % to 80 vol %, more preferably in the range of 15 vol % to 75 vol %, based on the total volume of the conversion element.

As described above, the infiltration matrix infiltrates the pores of the matrix of the conversion element of the invention. As a result of the infiltration, the conversion element according to the invention has particularly low porosity.

In the context of the invention, porosity may be measured by analysis of micrographs in SEM, or by gas sorption. Alternatively, porosity may be measured by X-ray images, 2D and/or 3D tomographic images. Both methods allow accurate determination of porosity of the conversion element. Using the X-ray image, the pores can be characterized, for example, by means of gray levels in the X-ray image. Alternatively, element mapping is also possible to determine porosity if the pores are filled with epoxy (embedding material), for example. Determination by BET with the surface being open is also conceivable.

A conversion element according to the invention has a porosity in the range of 0 to 20 vol %, based on the total volume of the conversion element.

In one embodiment, the conversion element has a porosity in the range of 1 to 10 vol %, preferably in the range of 3 to 7 vol %, particularly preferably in the range of about 5 vol %, based on the total volume of the conversion element.

The conversion element further comprises 10 to 50 vol % of at least one phosphor, based on the total volume of the conversion element.

In one embodiment, the conversion element according to the invention comprises 15 to 45 vol % of at least one phosphor, preferably 20 to 40 vol % of at least one phosphor, particularly preferably 25 to 35 vol % of at least one phosphor, based on the total volume of the conversion element.

Due to the presence of the matrix comprising at least one infiltration matrix, the amount of the phosphor can be chosen to be particularly low.

Very generally, a phosphor is understood to be a substance that converts electromagnetic radiation of a first wavelength range into electromagnetic radiation of a second wavelength range.

The phosphors can be selected from the group consisting of garnets (backbone of $AlO_4$ or $(AlGa)O_4$ units), nitridosilicates (backbone of $SiN_n$ units), oxynitridosilicates (backbone of $Si(N,O)_n$ units), alumonitridosilicates (backbone of $(Al,Si)N_n$ units), alumooxynitridosilicates (backbone of $(Al,Si)(O,N)_n$ units), SCASN $((Ca,Sr)AlSiN_3:Eu^{2+})$, oxysilicates (backbone of $SiO_n$ units), perovskites and quantum dots. The quantum dots may be used with or without organic ligands or with or without inorganic coating, such as $SiO_2$ coating.

Exemplary phosphors include $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu2+$, $(Sr,Ba,Ca)_2(Si,Al)_5N_8O)_8:Eu^{2+}$, $(Ca,Sr)_8Mg(SiO_4)_4Cl_2:Eu^{2+}$, $(Sr,Ba)Si_2N_2O_2:Eu^{2+}$.

Quantum dots may be, for example, CdSe, InP, or ZnSe.

In one embodiment, at least two phosphors are present in a conversion element according to the invention.

Optionally, the conversion element according to the invention may further comprise at least one additive. The additive may be at least one material selected from the group consisting of nanoparticles, nanowires, nanoplatelets, scattering particles, curing agents, catalysts, and filler particles.

In one embodiment, the at least one additive may be an oxide, especially in the form of nanoparticles, nanowires, nanoplatelets, and mixtures thereof.

According to the present invention, nanoparticles have a size of about 2 to about 200 nm. In one embodiment, nanoparticles have a size of about 2 nm to about 100 nm. In another embodiment, the nanoparticles have a size of about 2 nm to about 50 nm. In another embodiment, the nanoparticles have a size of about 3 nm to about 20 nm.

According to the present invention, nanowires have a length of about 150 nm to about 1 μm. In one embodiment, nanowires have a length of about 300 nm to about 800 nm. In another embodiment, the nanowires have a length of about 500 nm to about 700 nm.

According to the present invention, nanowires have a diameter of about 3 nm to about 50 nm. In one embodiment, the nanowires have a diameter of about 5 nm to about 40 nm. In another embodiment, the nanowires have a diameter of about 10 nm to about 20 nm.

In one embodiment, the respective mentioned lengths of the nanowires may be combined with the respective diameters. Thus, a nanowire may have a length of about 150 nm to about 1 µm and a diameter of about 3 nm to about 50 nm.

According to the present invention, nanoplatelets have an edge length of about 150 nm to about 1 µm. In one embodiment, the nanoplatelets have an edge length of from about 200 nm to about 800 nm. In another embodiment, the nanoplatelets have an edge length of about 400 nm to about 600 nm.

According to the present invention, nanoplatelets have a thickness of about 3 nm to about 50 nm. In one embodiment, the nanoplatelets have a thickness of about 5 nm to about 40 nm. In another embodiment, the nanoplatelets have a thickness of about 10 nm to about 20 nm.

In one embodiment, said edge lengths of the nanoplatelets may be combined with the respective thicknesses. Thus, a nanoplatelet may have an edge length of from about 150 nm to about 1 µm and a thickness of from about 3 nm to about 50 nm.

For example, the refractive index may be increased by using a nanomaterial as an additive. Suitable nanomaterials can be nanoparticles, nanorods, nanowires or nanolayers. They may be formed from $TiO_2$, $ZrO_2$, $BaTiO_3$, $SrTiO_3$, $Al_2O_3$, $Nb_2O_5$, $HfO_2$, ZnO, and the like.

Oxidic nanoparticles may also be present as additives. Examples of this are $Al_2O_3$, $SiO_2$, $TiO_2$, $ZrO_2$, ZnO, etc. Such oxides can contribute to the stabilization of the conversion element and lower the processing temperature.

To improve thermal conductivity, particles and wires can be added as additives to the conversion element. Exemplary materials are diamond (~2200-3320 W/m·K), SiC (~270-490 W/m·K), GaP (~100-110 W/m·K), AlN (~170-285 W/m·K). However, other materials having similar conductivity values to those mentioned above may also be used.

Scattering particles may also be present in the conversion element as an additive. Exemplary scattering particles are $Al_2O_3$, $SiO_2$, $TiO_2$, $ZrO_2$, ZnO, which are used depending on the refractive index of the matrix and infiltration matrix. In one embodiment, the refractive index of the matrix or infiltration matrix differs from that of the scattering particles by at least 0.1.

Furthermore, curing agents, especially chemical curing agents, may be present in the conversion element. By adding a curing agent, especially to the matrix, it may be achieved that the conversion element is particularly stable against moisture. In some examples, addition of a curing agent may also lower the temperature of curing (e.g., to 80° C.). Chemical curing is preferably accomplished by ion exchange. Exemplary curing agents include aluminum phosphates, forming alkali phosphate as a side product and incorporating aluminum into the silicate network of the matrix. Alternatively, halogen-containing compounds, for example silicofluorides, could be used as curing agents.

Of the additives, only one substance may be present at a time, or a combination of several additives. The additives are selected such that the desired properties may be adjusted to be particularly advantageous.

The additives may be present in the conversion element in an amount in the range from 0 vol % to 15 vol %, preferably in the range from 0 vol % to 10 vol %, particularly preferably in the range from 0 vol % to 7 vol %, based on the total volume of the conversion element.

The conversion element may have any geometric form. For example, the conversion element may be in the form of a layer, a lens, a partial filling of a lens, a cylindrical or conical filling in a highly reflective material.

It is another object of the present invention to provide a process for producing a conversion element comprising the steps of:
providing at least one matrix material,
adding at least one phosphor to the matrix material,
optionally adding at least one curing agent to the phosphor and matrix material mixture,
applying the phosphor and matrix material mixture and the optional curing agent to a substrate,
applying at least one infiltration material to the phosphor and matrix material mixture and the optionally present curing agent to form a pre-conversion element,
heating and/or drying the pre-conversion element, optionally grinding the pre-conversion element.

In one embodiment, the matrix material is an inorganic material. Preferably, the inorganic material is a water glass, such as lithium water glass, sodium water glass, potassium water glass, or a mixture thereof, which is in liquid form. In one embodiment, the water glass is a water glass dissolved in water.

Water glasses may have a modulus of 1.5 to 5, preferably a modulus of 2.5 to 4.5. The term modulus is known to those skilled in the art and refers to the molar ratio of $SiO_2$ to alkali oxide.

In one embodiment, the matrix material is added in an amount in the range of 40 to 85 vol %, preferably in the range of 55 vol % to 83 vol %, more preferably in the range of 60 vol % to 80 vol %, based on the total volume of the phosphor and matrix material mixture. Optionally, the matrix material may also have been diluted with water for viscosity adjusting.

According to the process of the invention, at least one phosphor is added to the matrix material. The phosphors may be phosphors as described above.

In one embodiment, the phosphor is added in an amount in the range of from 15 to 45 vol %, preferably in the range of from 20 vol % to 40 vol %, particularly preferably in the range of from 25 vol % to 35 vol %, based on the total volume of the phosphor and matrix material mixture.

Furthermore, at least one curing agent, especially a chemical curing agent, may optionally be added to the phosphor matrix material mixture. By adding a curing agent, moisture stability of the conversion element can be achieved. Chemical curing is preferably accomplished by ion exchange.

Exemplary curing agents are aluminum phosphates, forming alkali phosphate as a side product and incorporating aluminum into the silicate network of the matrix. Alternatively, halogen-containing containing compounds, for example silicofluorides, could be used as curing agents.

In one embodiment, the matrix material is potassium water glass, which is chemically cured by ion exchange using aluminum phosphate as a curing agent. In this case, the potassium ions are exchanged for the aluminum ions, thus incorporating the aluminum ions into the silicate matrix of the water glass, which increases moisture stability. The side product of this reaction is potassium phosphate.

In one embodiment, the curing agent is added in an amount in the range of 1 to 15 vol %, preferably in the range of 2 vol % to 10 vol %, more preferably in the range of 3 vol % to 7 vol %, based on the total volume of the phosphor-matrix material mixture.

In one embodiment, the ratio (mass) between matrix material and curing agent is 7.2:1, preferably 7.1:1 and particularly preferably 6.9:1.

In another process step, the phosphor and matrix material mixture and the curing agent optionally present are applied to a substrate.

The substrate may be a permanent or temporary substrate. By permanent substrate is meant a substrate which remains in the conversion element or on which the conversion element remains. A temporary substrate is understood to be a substrate that is removed again before the conversion element is completed. Both the permanent and temporary substrates are excluded from the conversion element quantities.

The permanent substrate should have good resistance to moisture, radiation and temperature.

The permanent substrate can be a glass, e.g., borosilicate glass (such as D263 or D263T, or D263Teco from Schott or AF32 from Schott), glassy materials, glass ceramics, ceramics, e.g., alumina, sapphire, polycrystalline alumina, aluminum nitride, silicon carbide, or other transparent or translucent materials. In addition to the above-mentioned materials, a film, for example made of polyester such as silicone-coated polyethylene terephthalate film (Mylar), can also serve as a temporary substrate.

Likewise, non-transparent or non-translucent substrates are conceivable, especially reflective substrates, such as aluminum, silver, copper or other metals, ceramics, or metal oxides. This is especially interesting for a reflective "remote phosphor" (e.g. laser activated remote phosphor, LARP) application, wherein the conversion element is located at a certain distance from the light source.

In one embodiment, the substrate is a surface of a light source, especially the surface of a chip, to which the conversion element is directly applied, i.e., adhesive-free. In such an embodiment, the matrix material also serves as an adhesive for bonding the conversion element to the surface of the light source, e.g., the chip. The chip surface may have a passivation or be devoid of passivation. The chip may be a flip chip or a chip with a bond pad and bond wire.

In another embodiment, the substrate is a molded part, such as a lens, to the surface of which the conversion element is directly applied, i.e., without using adhesive. All or only some surfaces, completely as well as partially, may be coated. In a specific embodiment, the lens has a cavity or recess filled with the conversion element.

In another embodiment, the substrate is a highly reflective ceramic component having a cylindrical or tapered bore into which the conversion element is placed. In a specific embodiment, one side of the conversion element is coated with a dicroitic layer stack.

In another embodiment, the substrate is generally a chip wafer, which may optionally be patterned.

Application to a substrate of the phosphor and matrix material mixture and curing agent which is optionally present and eventually shaping may, for example, be performed using a coating knife, screen or stencil printing, dispensing, spraying, spin coating, dip coating, curtain coating, slot-die coating, inkjet printing, also any combination thereof or other coating and shaping processes known to the skilled person.

Optionally, complete or partial curing may be performed prior to applying the infiltration material. In this case, curing may be carried out by heating and/or drying. Curing is performed at temperatures where neither the embedded phosphor nor the substrate (if present) will be damaged. Typical temperatures may be in the range of between room temperature (25° C.) and 1000° C. In one embodiment, where, for example, phosphors having a high CRI are present and/or a chip is used as a substrate, the curing temperatures are in a range of between 30° C. and 600° C., preferably 50° C. and 500° C., ideally 80° C. and 350° C. (respective limits included).

Before infiltration, any side products formed may optionally be removed from the matrix material in an intermediate step.

After curing, application of the phosphor and matrix material mixture and the optionally present curing agent may be continued.

In another process step, at least one infiltration material is applied to the phosphor and matrix material mixture and the curing agent optionally present to form a pre-conversion element.

Preferably, the infiltration material is a material having a low curing temperature. A low curing temperature may avoid damage to the other components of the conversion element, such as the substrate, the light source (e.g. the chip), the wafer, the phosphors, etc.

In one embodiment, the infiltration material is an inorganic sol-gel material. Suitable sol-gel materials are described above.

In one embodiment, the infiltration material is one or more liquid precursor materials that crosslink with a small volume shrinkage to form materials such as polysilazane, silicone, or polysiloxane.

Herein, the volume shrinkage is, for example, <50 vol % or not more than 35 vol % or not more than 30 vol % or not more than 25 vol % or not more than 20 vol % or not more than 15 vol % or not more than 10 vol %.

Particles may also be included in the infiltration material, for example nanoparticles to adjust the material properties such as flow performance, shrinkage or optical properties, if necessary.

In another embodiment, the infiltration material is a material having high volume shrinkage, such as water glass or monoaluminum phosphate.

In this case, the volume shrinkage is, for example, at least 30 vol % or at least 35 vol % or at least 40 vol % or at least 45 vol % or at least 50 vol % or at least 60 vol % or at least 65 vol %.

In one embodiment, the infiltration material is added in the amount resulting in 100 vol %, including porosity, in the pre-conversion element after curing.

In one embodiment, the same infiltration material is used as the matrix material.

In another embodiment, an infiltration material is used which is different from the matrix material.

In another embodiment, a mixture of different infiltration materials is used.

In another process step for producing a conversion element, heating and/or drying of the pre-conversion element is performed. Typical temperatures may be in the range of between room temperature (25° C.) and 1000° C. In one embodiment in which, for example, phosphors having high CRI are present and/or a chip is used as a substrate, the temperatures for curing are in a range of between 30° C. and 600° C., preferably 50° C. and 500° C., ideally 80° C. and 350° C. (respective limits included).

Optionally, infiltration material may again be applied to the pre-conversion element after heating and/or drying of the pre-conversion element. The infiltration material may be the same infiltration material that has already been applied or any different infiltration material.

In another embodiment, at least one additive is added to the matrix material, the phosphor, the matrix material- and phosphor mixture and/or the infiltration material.

The additive may be selected from the group consisting of nanoparticles, catalysts, and the above-mentioned additives.

In one embodiment, the at least one additive is added in an amount in the range of 0.5% to 15 vol %, preferably in the range of 1% to 10 vol %, more preferably in the range of 2% to 7 vol %, based on the total volume of the conversion element.

A conversion element comprising at least one matrix including at least one infiltration matrix, 10 to 50 vol % of at least one phosphor, optionally at least one additive, wherein the conversion element has a porosity of 0 to 20 vol %, wherein the at least one matrix is selected from the group consisting of condensed water glass, condensed monoaluminum phosphate, condensed metal phosphate, and combinations thereof.

A process of producing a conversion element comprising the following steps providing at least one matrix material, adding at least one phosphor to the matrix material, optionally adding at least one curing agent to the phosphor-matrix material mixture, applying the phosphor and matrix material mixture and the curing agent optionally present to a substrate, applying at least one infiltration material to the phosphor matrix material mixture and the optionally present curing agent to form a pre-conversion element, heating and/or drying the pre-conversion element, wherein the at least one matrix material is selected from the group consisting of solutions comprising water glass, monoaluminum phosphate, metal phosphate and mixtures thereof.

As the conversion elements are often bonded to the chip, usually by means of silicone, which is poor in heat conducting, it is advisable to keep the adhesive thickness as low as possible. It is beneficial if the conversion element is maximally smooth and even, which may optionally be achieved by grinding and polishing. This process may also be carried out prior to infiltration of the infiltration matrix material, e.g. to simultaneously adjust the degree of conversion or the color location of the conversion element. Alternatively or additionally, grinding or polishing may be performed after infiltration.

If necessary, the conversion element may be cut to the desired size or separated, for example by sawing, followed by bonding to the chip surface and, if necessary, may be glob topped with filled (e.g. $TiO_2$) silicone.

In the case of a conversion element including a substrate, the substrate preferably faces away from the chip surface, thus causing the phosphor to be positioned close to the chip. In the case of a deliberately inhomogeneous phosphor distribution, for example by sedimentation, the phosphor-rich side is also preferably bonded close to the chip. Infiltration using an infiltration matrix material is alternatively or additionally also allowed following sawing.

The pore-free conversion elements described herein may not only be used as CLC (chip layer conversion), but are also suitable for remote applications, for example using lasers or laser diodes. Partial and complete conversion is also possible using the conversion elements according to the invention.

Furthermore, it is an object of the present invention to provide an optoelectronic semiconductor device comprising at least one conversion element according to the invention. An optoelectronic semiconductor device may be a light emitting diode (LED), or a laser diode.

Particularly advantageously, a conversion element according to the invention is arranged in the main radiation exit surface of a light source in an optoelectronic semiconductor device, such as an LED.

Conversion elements according to the invention may also be introduced in a wafer composite. This means that each conversion element does not have to be applied individually to a light source, such as a light-emitting layer, but can be applied in a composite, which enables more cost-effective production.

Semiconductor optoelectronic components according to the invention can be used as headlights, in projectors or for stage lighting. In principle, they are suitable for all applications where high luminance is required and which are operated at high current densities ($>1$ $A/mm^2$) and therefore require a conversion element having high thermal conductivity as described at the beginning.

Other advantageous embodiments and further developments of the invention will be apparent from the example embodiments described below in connection with the figures.

FIGURES

Identical elements, elements of the same kind or elements having the same effect are denoted by the same reference numbers in the figures. The figures and the proportions of the elements shown in the figures with respect to each another are not to be regarded as to scale. Individual elements, especially layer thicknesses, may rather be shown in an exaggerated large manner for better representability and/or understanding.

Figure 1:
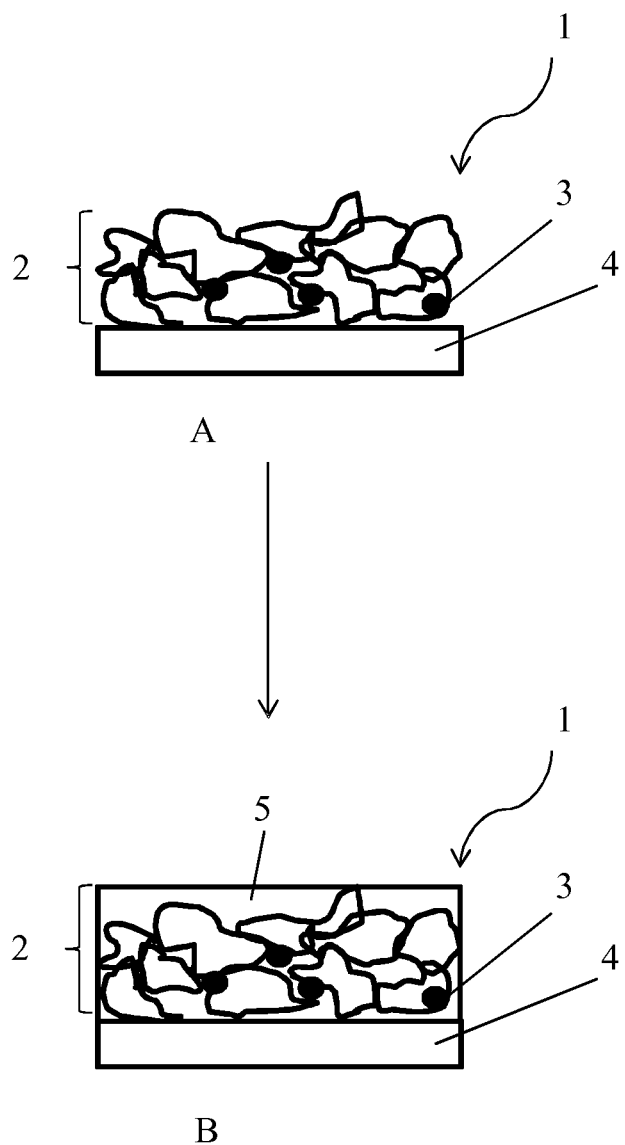
FIG. 1 shows a conversion element A without infiltration matrix and a conversion element B according to the invention including infiltration matrix.

FIG. 1 shows a conversion element 1 in panel A. The conversion element 1 comprises a matrix 2, phosphors 3 and a substrate 4. Panel B shows a conversion element 1 according to the invention comprising a matrix 2, phosphors 3, a substrate 4 and an infiltration matrix 5. The infiltration matrix 5 penetrates into and fills the pores of the matrix 2. The substrate 4 may optionally be present.

Figure 2:
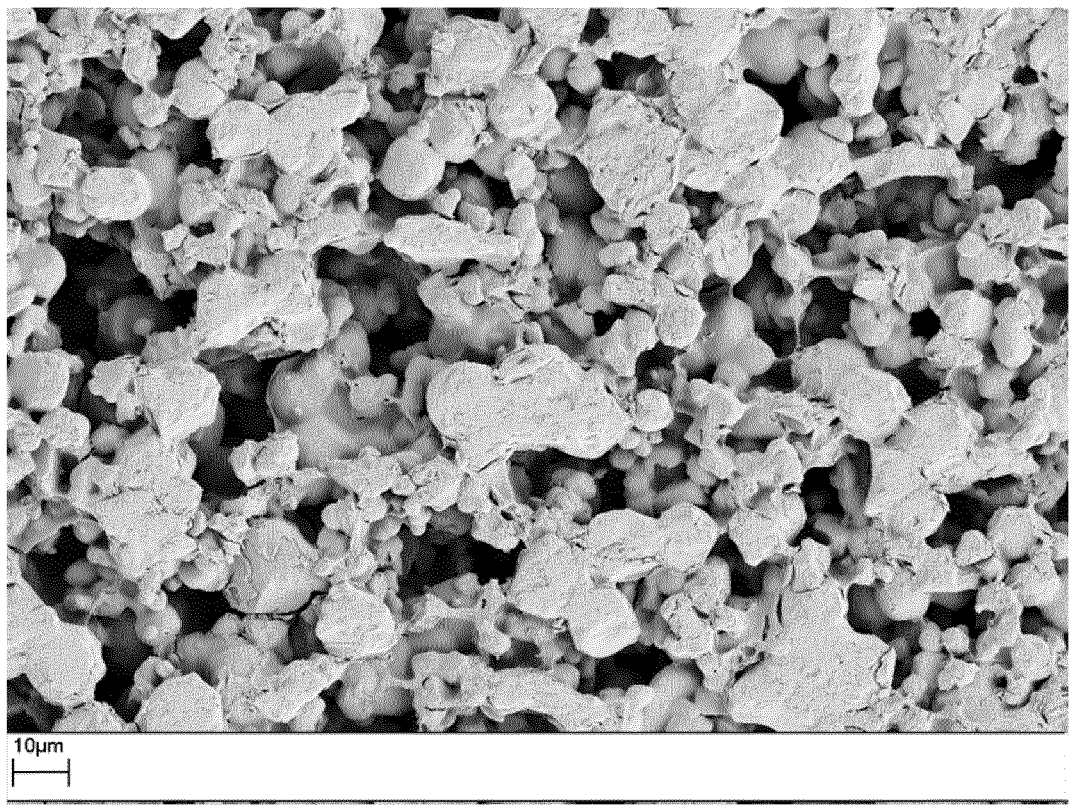
FIG. 2 shows an SEM image of a porous silicate matrix

FIG. 2 shows an SEM image of a matrix 2 after grinding. The composition and production of the conversion element KE1 will be described in the following examples.

Figure 3:
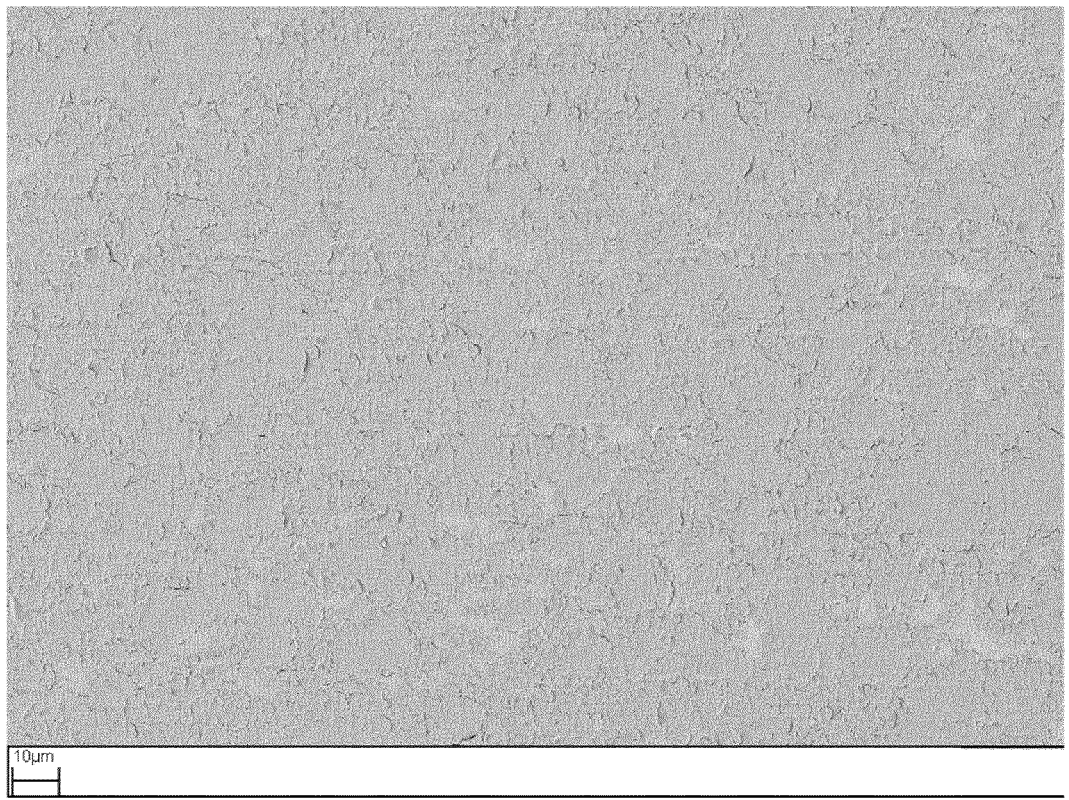
FIG. 3 shows an SEM image of a conversion element according to the invention including infiltration matrix

FIG. 3 shows an SEM image of a matrix 2 including an infiltration matrix 5. The composition and production of the conversion element KE3 will be described in the examples below.

Figure 4:
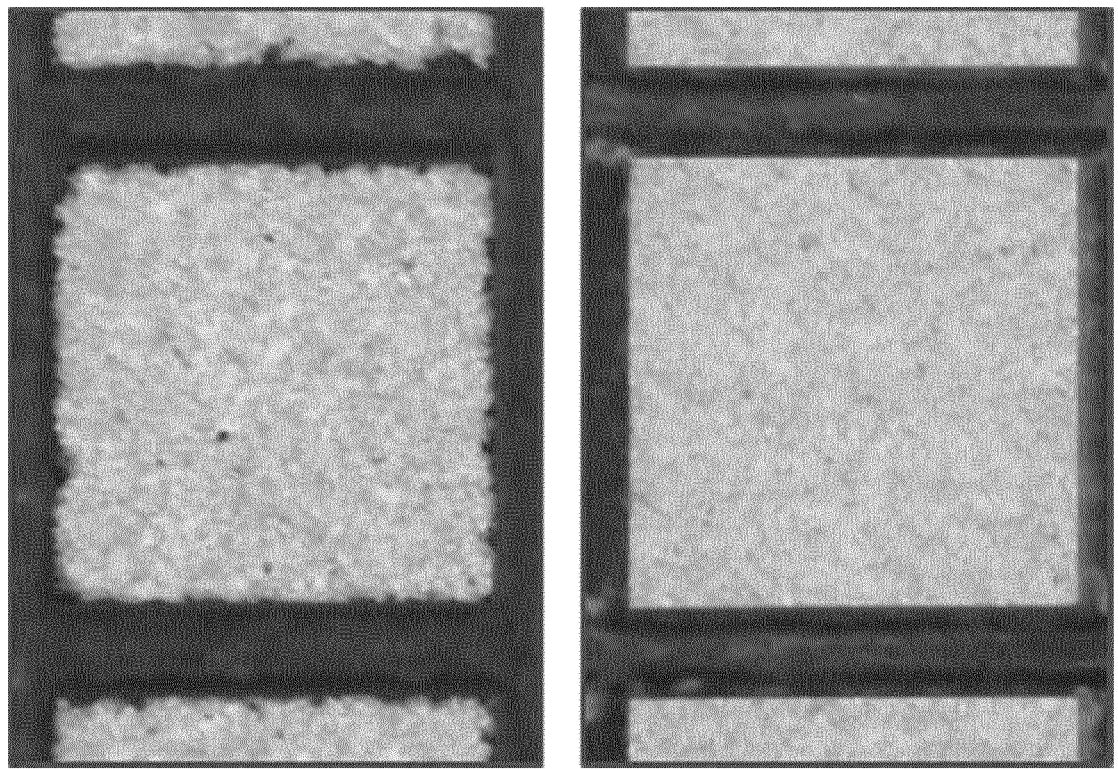
FIG. 4 shows comparative microscope images of conversion elements after sawing. On the left side, a conversion element without infiltration matrix is shown, and on the right side, a conversion element according to the invention including infiltration matrix is shown.

FIG. 4 shows microscope images of conversion elements 1 after sawing in comparison. On the left side, a conversion element including porous matrix 2 is shown and on the right a conversion element according to the invention including infiltration matrix 5 is shown. Herein, it may be seen that the conversion element 1 according to the invention including infiltration matrix 5 behaves more advantageously when performing sawing and is less prone to chipping at the edges. An intact edge is important both for good radiation characteristics and for glob topping with $TiO_2$-filled silicone. The size of the conversion elements shown is approximately 1 mm×1 mm.

Figure 5A:
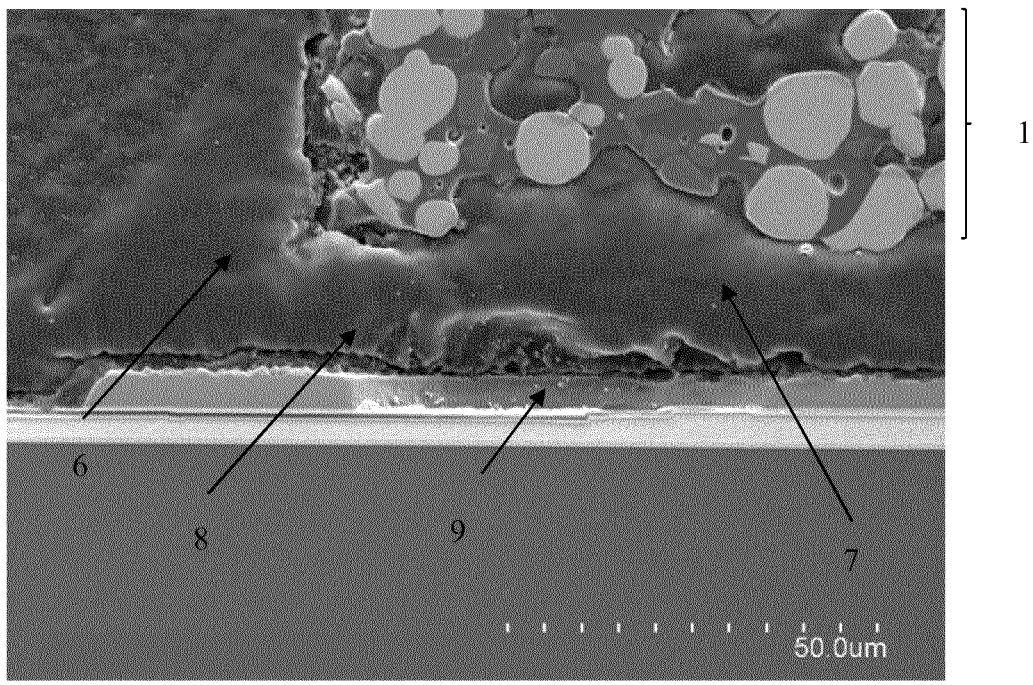
FIGS. 5a, 5b show SEM images (micrographs) of a porous matrix after bonding to a chip and glob topping with $TiO_2$-filled silicone.
Figure 5B:
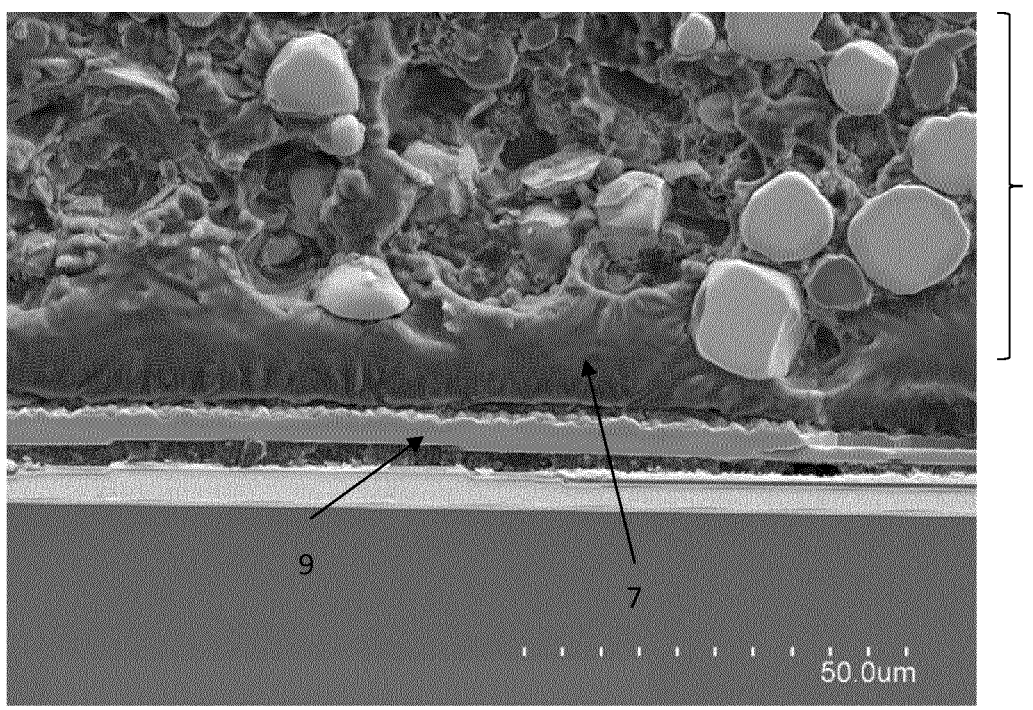

FIGS. 5a and 5b show SEM images (transverse section) of a porous matrix 2 (with substrate 4 (glass substrate is not shown in the image)) after bonding to a chip 9 and glob topping 6 with $TiO_2$-filled silicone. Due to the porosity and thus also more uneven surface, a lot of adhesive 7 (silicone in this case) is required for bonding to the chip 9, making the adhesive layer very thick. As a result, the distance from the conversion element 1 to the chip surface increases accordingly resulting in the so-called $TiO_2$ underflow 8, as may be seen in FIG. 5a. In FIG. 5b strong converter breakouts are visible resulting from lower mechanical stability caused by the pores. The composition and production of the conversion element KE1 will be described in the following examples.

Figure 6A:
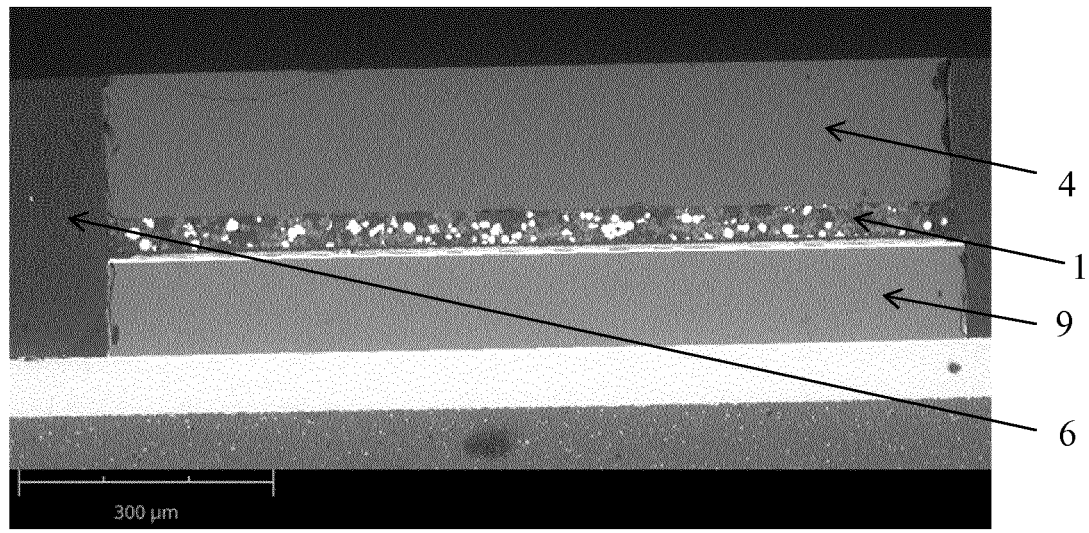
FIGS. 6a, 6b show an SEM image (micrograph) (FIG. 6a) and a cutout thereof (FIG. 6b) of a conversion element according to the invention including infiltration matrix and substrate after bonding to a chip and glob topping with $TiO_2$-filled silicone.
Figure 6B:
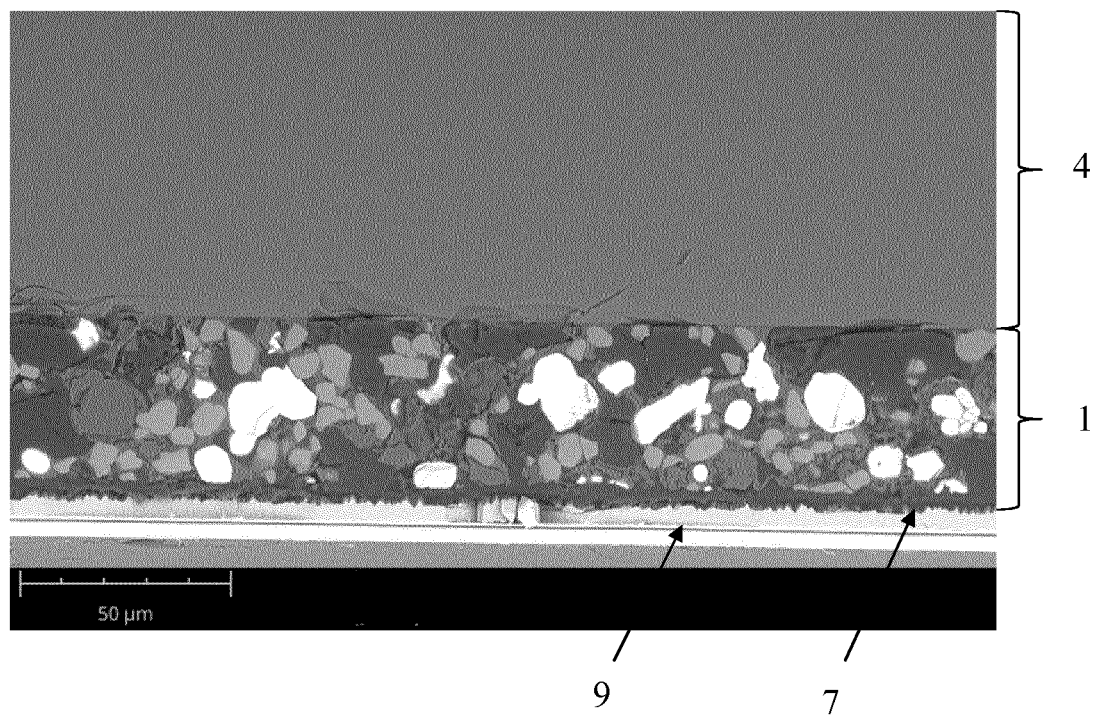

FIGS. 6a and 6b show an SEM image (cross sectional micrographs) (FIG. 6a) and a cutout (FIG. 6b) thereof of the conversion element 1 according to the invention including infiltration matrix 5 and substrate 4 after bonding to a chip 9 and glob topping 6 with $TiO_2$-filled silicone. The composition and production of the conversion element KE3 will be described in the following examples. It may be seen from the cross sectional micrograph that there is almost no porosity left in the conversion element 1 and that the infiltration matrix 5 has sufficiently been wetted and bonded. The lower porosity prevents $TiO_2$-filled silicone from being drawn through the pores into the conversion element 1 and into the adhesive layer 7 (so called $TiO_2$ underflow 8).

Figure 7:
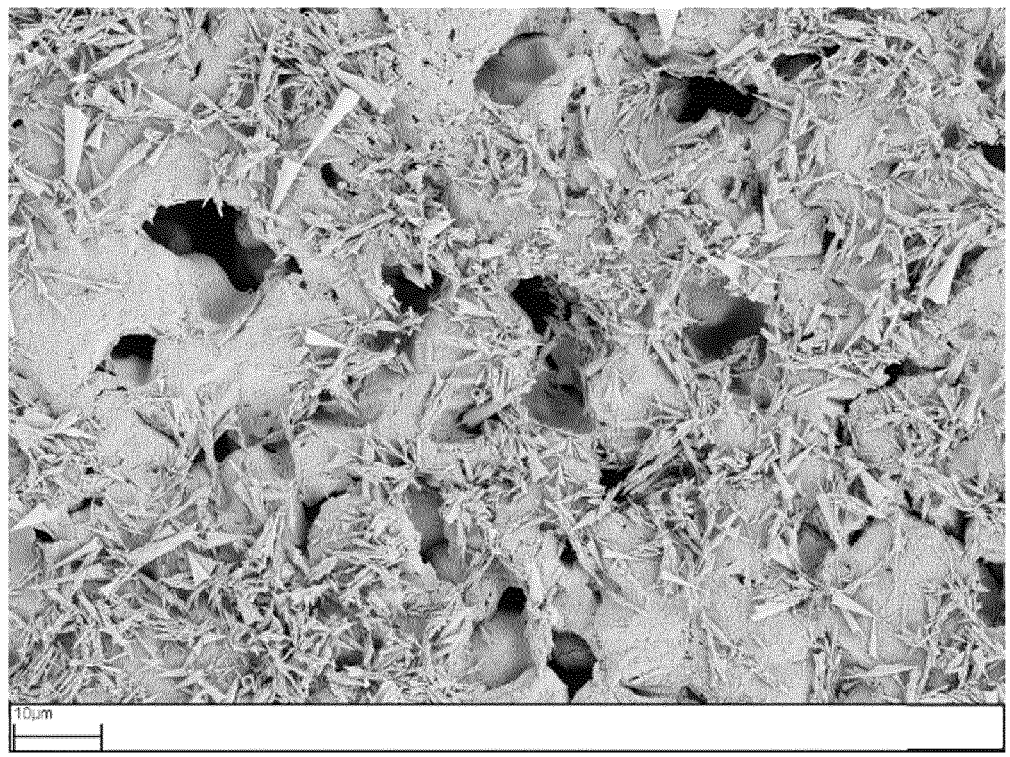
FIG. 7 shows a SEM image of a porous matrix following a moisture test in a "pressure cooker"

FIG. 7 shows a SEM image of a porous matrix 2 after a humidity test in the "pressure cooker". Herein, the conversion element 1 was aged in a closed system at 121° C. and 100% rel. humidity for 288 h. The strong crystal growth indicates some corrosion. The composition and production of conversion element KE1 will be described in the examples below.

Figure 8:
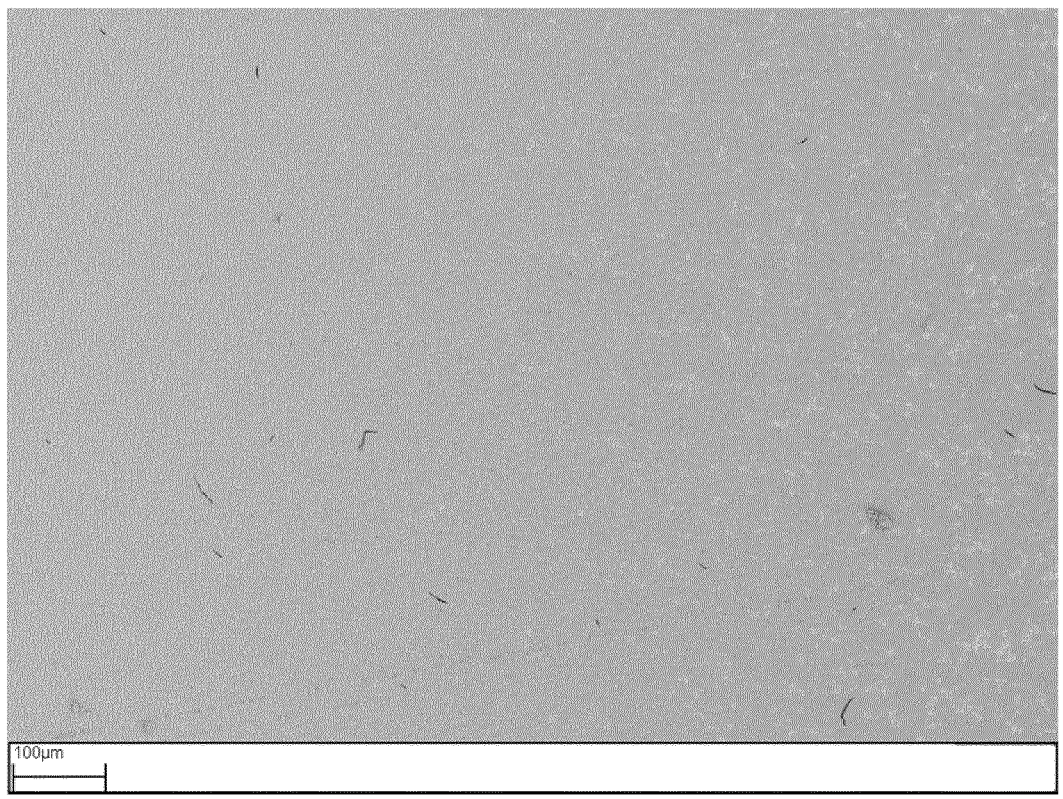
FIG. 8 shows a SEM image of a conversion element according to the invention including infiltration matrix prior to the moisture test in the "pressure cooker"
Figure 9:
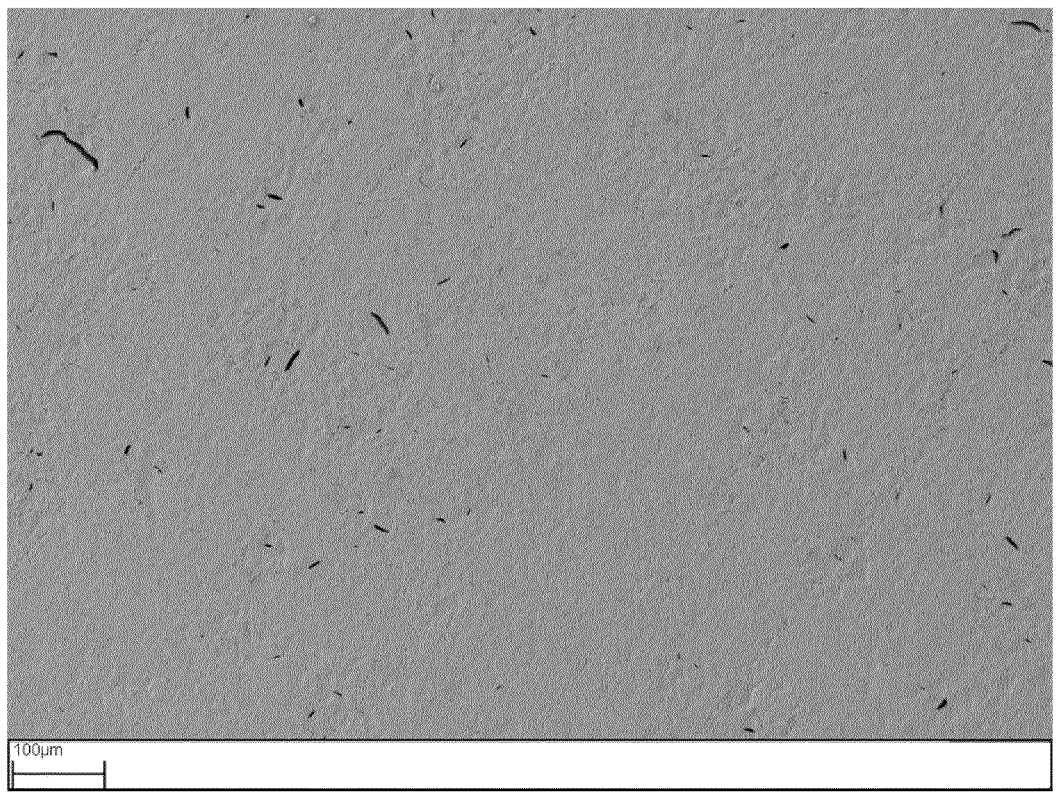
FIG. 9 shows a SEM image of a conversion element according to the invention including infiltration matrix following the moisture test in the "pressure cooker"

FIG. 8 shows an SEM image of a conversion element 1 according to the invention including infiltration matrix 5 before the humidity test in the "pressure cooker" as a comparison with FIG. 9. The composition as well as the production of the conversion element KE3 will be described in the following examples.

FIG. 9 shows a SEM image of a conversion element 1 according to the invention including infiltration matrix 5 (FIG. 8) after the moisture test in the "pressure cooker" at 121° C. and 100% relative humidity for 288 hours. In comparison with FIG. 7, virtually no difference will be revealed indicating good moisture resistance.

Figure 10:
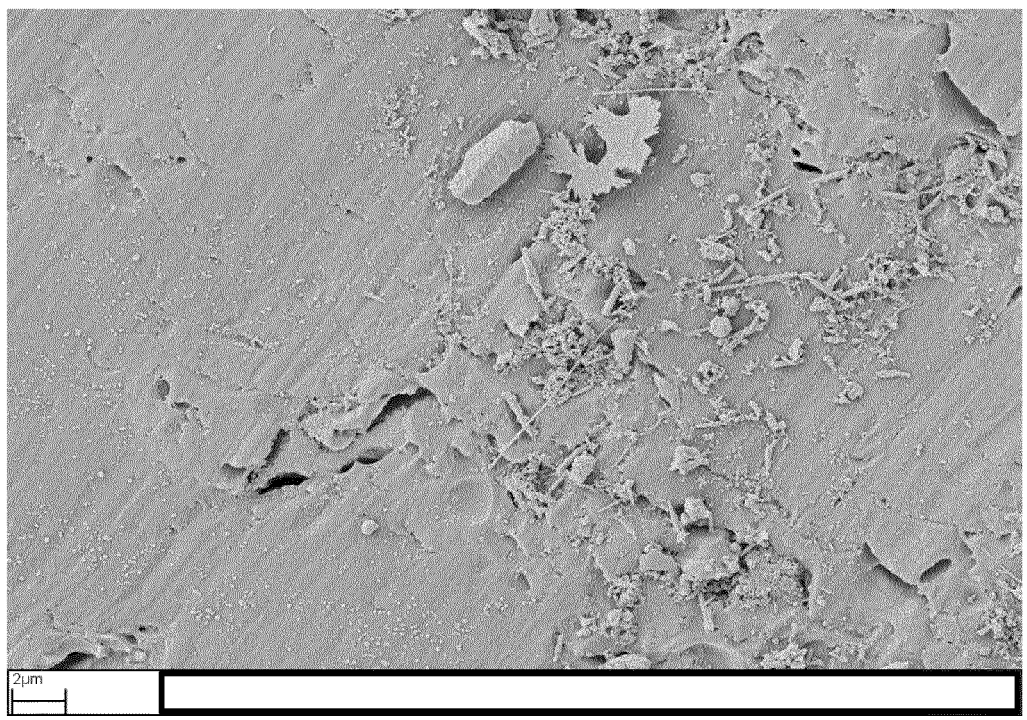
FIG. 10 shows a cutout of FIG. 9 in higher magnification

FIG. 10 shows a cutout of FIG. 9 at 30× higher magnification. On the surface, not more than weak crystal growth is visible, although the magnification is 3× as high as that of FIG. 7. This demonstrates the improved moisture resistance of the conversion element 1 including infiltration matrix 5 according to the invention.

Figure 11:
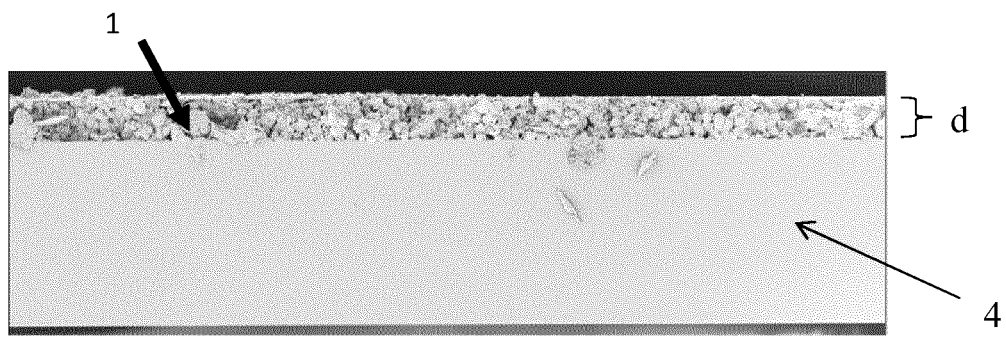
FIG. 11 shows an SEM image of the porous matrix in cross-section

FIG. 11 shows an SEM image of the porous matrix 2 (with substrate 4) in cross-section (of the sample from FIG. 7). The thickness d of the conversion element 1 is about 40 μm. The composition and production of the conversion element KE1 will be described in the following examples.

Figure 12:
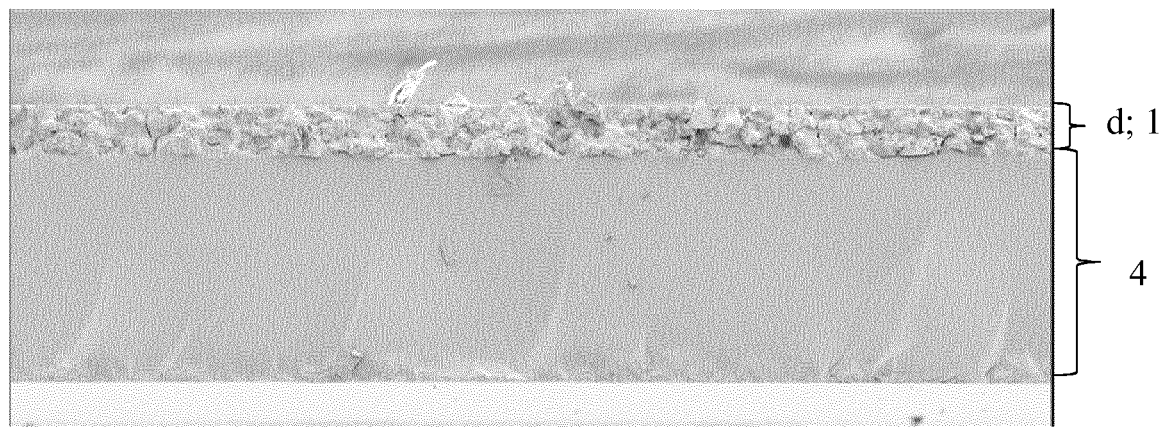
FIG. 12 shows an SEM image of a conversion element according to the invention including infiltration matrix in cross-section

FIG. 12 shows an SEM image of a conversion element 1 according to the invention including infiltration matrix 5 and glass substrate 4 in cross-section (of the sample from FIG. 8). The thickness d of the conversion element 1 is about 40 μm. Compared with FIG. 11, this shows that the porosity has also been significantly reduced in volume (not only at the surface) by the infiltration matrix 5. The composition and production of the conversion element KE3 will be described in the following examples.

Figure 13:
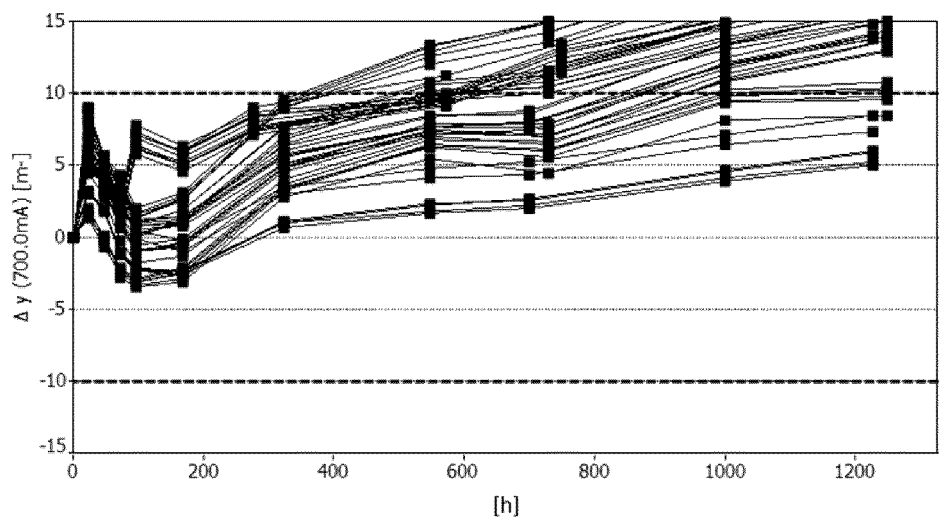
FIG. 13 shows the performance of a porous matrix after bonding to a chip and glob topping with $TiO_2$-filled silicone in an aging test.

FIG. 13 shows the performance of a porous matrix 2 (with substrate 4) after bonding to a chip 9 and glob topping 6 with $TiO_2$-filled silicone in an aging test. Herein, the LEDs were operated in an environment of 85° C. and 85% rel. humidity at 1.5 A. In addition, the LEDs were switched on and off recurrently at a specified interval. Herein, the course of the Cy coordinate of the color location over a test duration of 1200 h is shown. In the graph one line corresponds to one LED. After 1000 h, a change of the Cy value by more than 10 points may already be observed for most LEDs indicating changes in the conversion element 1.

Figure 14:
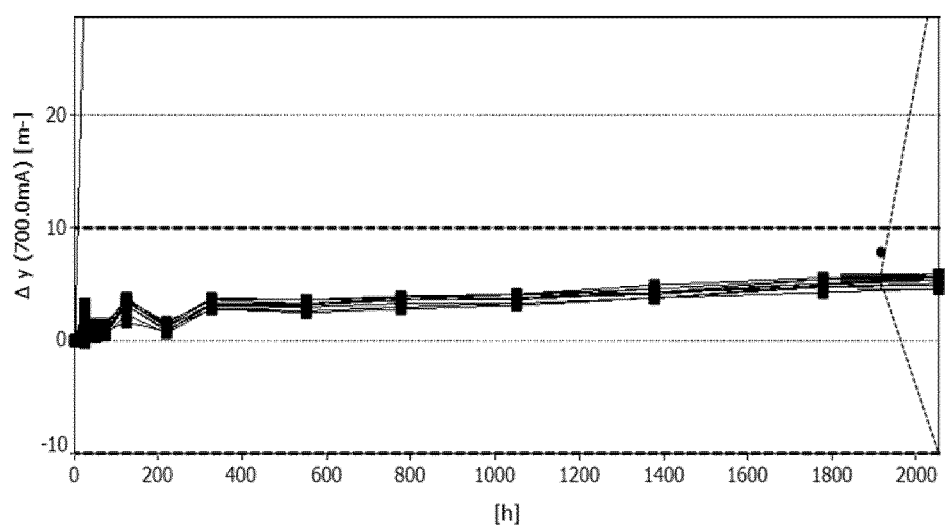
FIG. 14 shows the performance of the conversion element according to the invention including infiltration matrix after bonding to a chip and glob topping with $TiO_2$-filled silicone in the aging test.

FIG. 14 shows the performance of a conversion element 1 according to the invention including infiltration matrix 5 (and substrate 4) after bonding to a chip 9 and glob topping 6 with $TiO_2$-filled silicone in the aging test. The test conditions are comparable to those in FIG. 13, wherein it is readily apparent that the Cy value is clearly more stable over time and has changed by significantly less than 10 points even after 2000 h, indicating better stability of the conversion element 1 of the invention (compared to the porous matrix 2).

Table 1 shows the measured thermal conductivity of two conversion elements KE1 and KE2 described in the following examples. The two conversion elements are comparable in terms of "basic composition" and similar in thickness, but differ in porosity, which has been reduced in conversion element KE2 by an infiltration matrix. Consequently, due to the higher thermal conductivity of the infiltration matrix compared to the gas-filled pores, the thermal conductivity of the entire conversion element is also increased.

TABLE 1

Thermal conductivity with and without infiltration matrix

| Conversion element | Thermal conductivity $[\lambda/Wm^{-1}K^{-1}]$ | Infiltration matrix |
|---|---|---|
| KE1 | 0.876 | none |
| KE2 | 1.202 | includes infitration matrix |

EXAMPLES

Production of a Conversion Element

Warm and cool white phosphor mixture for high CRI and R9 applications:

Garnet phosphor (e.g., $(Lu,Y,Gd,Tb,Ce)_3(Al,Ga)_5O_{12}$, especially $(Y,Lu,Ce)_3(Al,Ga)_5O_{12}$, especially $(Lu,Ce)_3(Al_{1-x}Ga_x)_5O_{12}$ having a Ga content of $0\% \leq x \leq 60\%$) having at least one "258": $M_2(Al,Si)_5(N,O)_8$-type phosphor doped with Eu (M=Ca, Sr, Ba, Mg)

or phosphor derived therefrom and/or

"(S)CASN": phosphor as described in EP1696016 Al or WO 2005052087 Al, the disclosure contents of which is hereby incorporated by reference, for example (Sr, Ca)AlSi(N,O)$_3$:Eu and/or a "226" phosphor having an activator content of $>=0.5\%$, especially $>=2\%$, especially $>=3\%$ with divalent metals such as especially Sr and/or Ca, for example $Sr(Sr,Ca)Si_2Al_2N_6$:Eu Garnet phosphor as a cool white phosphor mixture having lower CRI:

Garnet phosphor (e.g. $(Lu,Y,Gd,Tb,Ce)_3(Al,Ga)_5O_{12}$, especially $(Y,Lu,Ce)_3(Al,Ga)_5O_{12}$, especially $(Lu,Ce)_3(Al_{1-x}Ga_x)_5O_{12}$ having a Ga content of $0\% \leq x \leq 60\%$), especially preferably $(Y, Ce)_3Al_5O_{12}$

Example 1

Water Glass as a Matrix for a Warm White Converter (3200 K) with High CRI and R9

(Conversion Element KE1)

A suspension of water glass and aluminum phosphate as chemical curing agent, if required, is prepared with a warm white phosphor mixture (see above). Optionally, the suspension can be diluted with distilled water to adjust the viscosity. The solid to liquid mass ratio should be between 1:2 and 1:0.3 especially between 1:1.6 and 1:0.4. The suspension is applied to a substrate, for example, using a doctor blade. The doctor blade gap may be between 10-200 μm, in particular between 30-100 μm and ideally between 40-80 μm. Application rate is typically set between 1-99 mm/sec. Optionally, the conversion coating can be applied several times. Following the coating process, the freshly coated substrate is pre-dried in normal air, in a clean room or a drying oven. The room temperature and humidity can be kept constant between 18-50° C. and 0-80 g/m$^3$, in particular between 18-30° C. and 0-50 g/m$^3$, and ideally between 19-23° C. and 0-30 g/m$^3$. After pre-drying, the substrate is typically scored with a diamond cutter, broken into smaller pieces for further processing and baked at temperatures between RT-450° C. for 10 to 120 min.

After hardening, any side products may optionally be removed from the conversion element in an intermediate step.

Production using a matrix of condensed monoaluminum phosphate is also possible.

Infiltration with Silazane

Example 2

Infiltrated with Silazane 1 (Conversion Element KE2)

A sample is prepared according to example 1 and ground after curing to match the color location. After grinding, the sample is dripped with silazane (Merck KGaA Durazene® 1500 Slow cure), and the supernatant is removed using a glass doctor knife. Curing is performed in two steps of:

1. predrying at RT at 40-50% humidity and 2. curing at <350° C. for 4 h.

Example 3

Infiltrated with Silazane 2 (Conversion Element KE3)

A sample is prepared according to Example 1 and ground towards the color location after curing. After grinding, the sample was infiltrated with silazane 2 (type: Merck KGaA Durazene® 1500 Rapid Cure by doctoring. Curing was performed in two steps:

1. pre-drying at RT at 40-50% humidity and
2. curing at <350° C. for 4 h.

Optionally, multiple infiltrations may be performed to completely fill the microstructure.

Infiltrated with Silicone

Example 4

Infiltrated with Silicone 1 (Type: Shin-Etsu Co., Ltd. KJR9022-E-2-2L-2C) (Conversion Element KE4)

Similar to example 3, but infiltrated with silicone.

Optionally, infiltrate multiple times and adjust viscosity using solvent to completely fill the microstructure.

Example 5

Infiltrated with Silicone 2 (Type: Shin-Etsu Co., Ltd. LPS3412) (Conversion Element KE5)

Similar to example 3, except using a cold white mixture (6500 K) (see above) and infiltrated with silicone.

Optionally, infiltrate several times and adjust viscosity using solvent to completely fill the microstructure.

Example 6

Infiltrated with Silicone 2 (Type: Shin-Etsu Co., Ltd. LPS3412) (Conversion Element KE6)

Similar to example 5, except using warm white mixture (3200 K) (see above) and infiltrated with silicone.

Optionally, infiltrate several times and adjust viscosity using solvent to completely fill the microstructure.

Example 7

Infiltrated with Silicone 3 (Type: Shin-Etsu Co., Ltd. LPS5400) (Conversion Element KE7)

Similar to example 3, except using cold white mixture (6500 K) (see above) and infiltrated with silicone.

Optionally, infiltrate several times and adjust viscosity using solvent to completely fill the microstructure.

Infiltration with polysiloxane is also possible.

Infiltration with water glass or monoaluminum phosphate or another aluminum phosphate is also possible.

Example 8

Water Glass Matrix Infiltrated with Silicate-Based Sol-Gel Solution (Conversion Element KE8)

A mixture of potassium water glass (solution), aluminum phosphate as a chemical curing agent and garnet phosphor particles (YAG:Ce) is prepared. Optionally, the mixture is diluted with water. The mass ratio of solid components to liquid components in the mixture is between 1:2 and 1:0.3. The mixture is applied to flipchip wafer segments using a doctor knife to a thickness of between 10 μm and 150 μm, preferably between 15 μm and 100 μm, more preferably between 20 μm and 90 μm. Subsequently, the coated flipchip wafer segment is dried and cured at 150° C. for 2 h.

The conversion layer is subsequently coated using a silicate based sol-gel solution to infiltrate the porous structure of the water glass matrix with the silicate based sol. After drying, another infiltration step, or a curing step at 150° C. may be added. After curing, the pores will be filled with $SiO_2$, which has a refractive index similar to water glass.

The silicate-based sol-gel for the infiltration matrix may be a mixture of different metal precursors or a single metal precursor, both including additives, if required. Hydrolysis may be catalyzed by acid or base.

Example 9

Water Glass Matrix Infiltrated with Silicate-Based Sol-Gel Solution (Conversion Element KE9)

Similar to example 8, except using a warm white phosphor mixture (e.g. LuAG and CaAlSiN).

Example 10

Water Glass Matrix Infiltrated with Titanium-Based Sol-Gel Solution (Conversion Element KE10)

A mixture from potassium water glass (solution), aluminum phosphate as a chemical curing agent and garnet phosphor particles (YAG:Ce) is prepared. Optionally, the mixture is diluted with water. The mass ratio of solid components to liquid components in the mixture is between 1:2 and 1:0.3. The mixture is applied to a 6" UX:3 chip wafer using a doctor knife, to a liquid components thickness between 10 μm and 150 μm, preferably between 15 μm and 100 μm, more preferably between 20 μm and 90 μm. The coated UX:3 chip wafer is subsequently dried and cured at temperatures between 70° C. and 350° C.

The conversion layer is subsequently re-coated with a titanium-based sol-gel solution, so that the porous structure of the water glass matrix is infiltrated with the titanium-based sol. After drying, another infiltration step, or a curing step at 300° C. for 1 h may be added. After curing, the pores will be filled with $TiO_2$, which has a much higher refractive index than water glass.

Example 11

Mixed Water Glass Matrix Infiltrated with Zirconium-Based Sol-Gel Solution (Conversion Element K11)

Similar to example 10, except using a white phosphor mixture (e.g. LuAG and CaAlSiN) and a matrix of a mixture of 50 vol. % potassium water glass and 50 15 vol.% lithium water glass. After deposition and curing of the water glass based conversion layer, the pores/channels are infiltrated with zirconium sol and cured at a temperature of 350° C.

Example 12

Phosphor-in-Glass

A conversion solution based on a liquid inorganic glassy binder man be applied to a transparent substrate by doctor blade coating or spin coating. The substrate may be glass or sapphire. Phosphors may be oxygen-based phosphors (e.g., YAG, LuAG) or nitride- and oxynitride-based phosphors (α-SiAlON, β-SiAlON, SCASN, CASN) or combinations thereof.

Inorganic glassy binders may be phosphate- or silicate-based, such as aluminum phosphate, potassium silicate, sodium silicate, lithium silicate, or combinations thereof. During sintering, the glassy binders form interbranched pores. The sintering conditions for the first coating of the conversion material based on inorganic glassy binder is usually >300° C. due to the required stability. Such temperatures result in certain porous structures, while the heating rate influences the degree of pore formation. After sintering, the conversion layer on the transparent substrate may be coated with a sol-gel solution by using a doctor knife or spin coating to fill the pores. The drying performance of the sol-gel solution may be adjusted by changing the base solvent, as the sol solution is to fill all pores before drying and converting to a gel. In this example, an inorganic glass binder is used as a silicate glass, such as potassium silicate glass, while a TEOS-based sol-gel solution with ethanol/water as the solvent is used as the silicate-based sol-gel solution. The phosphors are a mixture of YAG and CASN. Coating from an inorganic glass binder is performed by using a doctor knife on a glass substrate. Sintering is performed at >350° C., resulting in a porous structure. Subsequently, the conversion layer is coated with silicate-based sol-gel solution at room temperature. Drying is performed at >60° C., while sintering is performed at a temperature of >100° C. but below 200° C. The infiltrated conversion layer may subsequently be separated into the desired platelet size.

Example 13

Phosphor-in-Glass

A similar conversion solution based on liquid inorganic glassy binder may be coated on a non-transparent substrate, such as Teflon or silicone. Regardless of the phosphor used, the slight hydrophobicity of the surface of the non-transparent substrate may induce peeling of the phosphor layer after sintering. In this example, a conversion solution of alkali-containing potassium silicate mixed with YAG and CASN is coated on a slightly hydrophobic silicone wafer by using a doctor knife, spin coating, slot die coating or wire coating. The slight hydrophobicity is induced by cleaning the silicone wafer with acetone or toluene. The coated conversion layer is sintered at temperatures between 150 and 350° C., which induces formation of interconnected pores. In addition, the sintering process may induce delamination of the conversion layer from the substrate, resulting in a stand-alone phosphor-in-glass layer having a thickness of about 150 to 200 μm. The pores of the layer are filled with TEOS-based sol-gel solution by using a doctor knife or spin coating. Drying and sintering of the sol-gel material is performed at temperatures >60° C. and >100° C., respectively, but lower than 200° C. The infiltrated conversion layer may be separated into the desired platelet size.

Conversion elements according to the invention may be highly filled with phosphor, the phosphor being embedded in an inorganic matrix that initially has porosity in the form of interconnected channels, which are subsequently filled by infiltration with an infiltration material, resulting in a compact conversion element having high thermal conductivity.

The present invention is suitable for applications with high current densities (>1 A/mm$^2$) as well as for cool white and warm white applications with high CRI (CRI≥80).

Infiltration, which may be done with the same or a different matrix-forming infiltration matrix material, fills most of the pores/channels created during curing/drying, which may result in a compact conversion element having one or more of the following advantages. For example, the low porosity of the conversion material may reduce scattering, allowing for higher efficiency of the semiconductor optoelectronic device. The amount of adhesive (e.g., silicone adhesive) that is previously required to be applied between the light source and the conversion element may significantly be reduced, or the adhesive may be avoided at all. Resorption of the adhesive may thus be avoided and, in addition, better thermal connection to the light source (e.g., the light-emitting chip) may be enabled. By reducing or avoiding the adhesive, the component size may also be reduced.

In subsequent glob topping, for example, silicone and/or silicone filled with TiO$_2$ it may be ruled out for the potting material to penetrate into the matrix, as the pores are already and at least largely filled with the infiltration matrix. In a particular embodiment, the pores filled with the infiltration matrix may also be present only on the surfaces of the conversion element.

Subsequent processing may also be very advantageous. As the matrix is generally less elastic than, for example, a silicone matrix of prior art conversion elements, the conversion element may readily be sawn. By filling the pores with the infiltration matrix, the matrix is supported and less or no chipping occurs when sawing the conversion elements. Furthermore, due to the presence of the infiltration matrix, impurities generally do not penetrate the matrix during sawing.

In addition, conversion elements according to the invention can exhibit good grindability, improved moisture stability and improved stability at high operating currents.

By selecting the appropriate infiltration matrix having a specific refractive index, scattering properties of the conversion element may be improved.

Consequently, optoelectronic semiconductor devices, such as LEDs, may be produced with higher efficiency.

The invention is not limited thereto by the specification and the embodiments set forth therein. The invention rather encompasses any new feature as well as any combination of features, especially including any combination of features in the patent claims, even if that feature or combination itself is not explicitly stated in the patent claims or embodiments.

This patent application claims priority of German patent application 102018128536.1, the disclosure of which is hereby fully incorporated by reference.

LIST OF REFERENCE NUMBERS

1 Conversion element
2 Matrix
3 Phosphor
4 Substrate
5 Infiltration matrix
6 Glob top
7 Adhesive, adhesive layer
8 TiO$_2$ underflow
9 Chip

The invention claimed is:

1. A conversion element comprising:
   at least one matrix including at least one infiltration matrix,
   10 to 50 vol % of at least one phosphor,
   optionally at least one additive,
   wherein the conversion element has a porosity of 0 to 20 vol %,
   wherein the at least one matrix is selected from the group consisting of condensed water glass, condensed monoaluminum phosphate, condensed metal phosphate, and combinations thereof.

2. The conversion element according to claim 1 wherein the at least one infiltration matrix is selected from ZrO$_2$, TiO$_2$, Al$_2$O$_3$, SiO$_2$, Y$_2$O$_3$, HfO$_2$ and combinations thereof.

3. The conversion element according to claim 1, wherein the at least one phosphor is selected from the group consisting of (Y,Gd,Tb,Lu)$_3$(Al,Ga)$_5$O$_{12}$:Ce$^{3+}$, (Sr,Ca)AlSiN$_3$:Eu$^{2+}$, (Sr,Ba,Ca,Mg)$_2$Si$_5$N$_8$:Eu$^{2+}$, (Ca,Sr,Ba)$_2$SiO$_4$:Eu$^{2+}$, α-SiAlON:Eu$^{2+}$, β-SiAlON:Eu$^{2+}$, (Sr,Ca)S:Eu$^{2+}$, (Sr,Ba,Ca)$_2$(Si,Al)$_5$N,O)$_8$:Eu$^{2+}$, (Ca,Sr)$_8$Mg(SiO$_4$)$_4$Cl$_2$Eu$^{2+}$, (Sr,Ba)Si$_2$N$_2$O$_2$:Eu$^{2+}$, perovskites, and quantum dots of CdSe, InP or ZnSe.

4. The conversion element according to claim 1, wherein the at least one additive is selected from nanoparticles, scattering particles, nanoplatelets, curing agents, filler particles and catalysts.

5. A process of producing a conversion element comprising the following steps:
   providing at least one matrix material,
   adding at least one phosphor to the matrix material,
   optionally adding at least one curing agent to the phosphor-matrix material mixture,
   applying the phosphor and matrix material mixture and the curing agent optionally present to a substrate,
   applying at least one infiltration material to the phosphor matrix material mixture and the optionally present curing agent to form a pre-conversion element,
   heating and/or drying the pre-conversion element,
   wherein the at least one matrix material is selected from the group consisting of solutions comprising water glass, monoaluminum phosphate, metal phosphate and mixtures thereof.

6. The process according to claim 5, wherein the at least one phosphor is selected from the group consisting of (Y,Gd,Tb,Lu)$_3$(Al,Ga)$_5$O$_{12}$:Ce$^{3+}$, (Sr,Ca)AlSiN$_3$:Eu$^{2+}$, (Sr,Ba,Ca,Mg)$_2$Si$_5$N$_8$:Eu$^{2+}$, (Ca,Sr,Ba)$_2$SiO$_4$:Eu$^{2+}$, α-SiAlON:Eu$^{2+}$, β-SiAlON:Eu$^{2+}$, (Sr,Ca)S:Eu$^{2+}$, (Sr,Ba,Ca)$_2$(Si,Al)$_5$N,O)$_8$:Eu$^{2+}$, (Ca,Sr)$_8$Mg(SiO$_4$)$_4$Cl$_2$:Eu$^{2+}$, (Sr,Ba)Si$_2$N$_2$O$_2$Eu$^{2+}$, perovskites, and quantum dots of CdSe, InP or ZnSe.

7. The process according to claim 5, further comprising the step of:
   adding at least one additive to the phosphor-matrix material mixture.

8. The process according to claim 7, wherein the at least one additive is selected from the group consisting of nanoparticles, catalysts, scattering particles, nanoplatelets, curing agents and filler particles.

9. The process according to claim 5, wherein heating is to a temperature in the range of 50° C. to 500° C.

10. The conversion element produced according to claim 5.

11. A semiconductor optoelectronic device comprising at least one conversion element according to claim 1.

12. A conversion element comprising:
at least one matrix including at least one infiltration matrix,
10 to 50 vol % of at least one phosphor,
optionally at least one additive,
wherein the conversion element has a porosity of 0 to 20 vol %;
wherein the at least one infiltration matrix is selected from $ZrO_2$, $TiO_2$, $Al_2O_3$, $SiO_2$, $Y_2O_3$, $HfO_2$ and combinations thereof.

13. A process of producing a conversion element comprising the following steps:
providing at least one matrix material,
adding at least one phosphor to the matrix material,
optionally adding at least one curing agent to the phosphor-matrix material mixture,
applying the phosphor and matrix material mixture and the curing agent optionally present to a substrate,
applying at least one infiltration material to the phosphor matrix material mixture and the optionally present curing agent to form a pre-conversion element,
heating and/or drying the pre-conversion element, and
adding at least one additive to the phosphor-matrix material mixture.

* * * * *